(12) United States Patent
Levy

(10) Patent No.: US 6,285,065 B1
(45) Date of Patent: Sep. 4, 2001

(54) COLOR FILTERS FORMED ON INTEGRATED CIRCUITS

(75) Inventor: Jeffrey M. Levy, Moshav Netofah (IL)

(73) Assignee: Tower Semiconductor, Ltd., Migdal Haemek (IL)

( * ) Notice: Subject to any disclaimer, the term of this patent is extended or adjusted under 35 U.S.C. 154(b) by 0 days.

(21) Appl. No.: 09/295,239

(22) Filed: Apr. 19, 1999

(51) Int. Cl.⁷ .................................................. H01L 31/0232
(52) U.S. Cl. ................................ 257/440; 257/432; 430/7
(58) Field of Search .................................... 257/432, 434, 257/440, 443; 430/7

(56) References Cited

U.S. PATENT DOCUMENTS

| | | | |
|---|---|---|---|
| 3,971,065 | 7/1976 | Bayer | 358/41 |
| 5,776,641 | 7/1998 | Roberts et al. | 430/7 |
| 5,798,542 | 8/1998 | Anagnostopoulos et al. | 257/232 |
| 5,889,277 | * 3/1999 | Hawkins et al. | 250/208.1 |
| 5,962,906 | * 10/1999 | Liu | 257/432 |
| 6,008,511 | * 12/1999 | Tokumitsu et al. | 257/232 |
| 6,111,247 | * 8/2000 | Sengupta | 250/226 |

FOREIGN PATENT DOCUMENTS 4-194802  * 7/1992 (JP).

* cited by examiner

*Primary Examiner*—Eddie C. Lee
*Assistant Examiner*—Allan R. Wilson
(74) *Attorney, Agent, or Firm*—Skjerven Morrill MacPherson LLP; Alan H. MacPherson; Christopher B. Allenby

(57) ABSTRACT

Light transmitting filter elements are formed in holes etched in a covering passivation layer overlying light sensing devices formed in an integrated circuit. Filter material is spun on to the wafer to fill the etched holes. The filter material is cured and etched back below the passivation layer top surface. Subsequent filter materials transmitting different light frequencies may be similarly spun on to fill subsequently etched holes, cured, and etched back to form additional filter elements. A contiguous structure of individual filter elements may be formed.

13 Claims, 4 Drawing Sheets

COLOR FILTERS FORMED ON INTEGRATED CIRCUITS

FIELD OF THE INVENTION

The present invention relates to light transmitting filters formed on integrated circuits and in particular to methods of forming color filters on processed wafers and resulting filter structures.

BACKGROUND

Filter material may be placed over photodetector devices formed in an integrated circuit. This filter material may be transparent to selected light frequencies or ranges of frequencies so that only light corresponding to a selected color reaches an underlying device. More than one filter material type may be used so that selected device groups each receive light corresponding to a distinct color. For example, three materials, each transmitting a unique one of red, green, and blue light, may be placed in a pattern over underlying devices.

Light transmitting material is typically formed over photodetector devices using conventional photolithographic methods. The light transmitting material is commonly a thick film of colored resist. Briefly, a material transmitting light for a color to be sensed is spun on to a processed wafer. The material is then exposed, developed, and etched using standard photolithographic methods so that it is patterned as individual islands over corresponding photo detecting devices. As a result, for a large color sensing device array, many individual color filter islands overlie photodetector devices in the integrated circuit. This process may be repeated using different material or materials to form additional individual filters transmitting light of different colors. The molecular structures of the thick films of resist typically produce poor imaging because the resist is usually optimized to transmit the desired color, not for etch resolution. Thick film molecular lengths often exceed the sub-micrometer resolution required in contemporary integrated circuits (ICs) so that precise filter placement is difficult. A more significant problem is that one or more of the resist material islands may loosen or fall off (on the order of a few islands per million).

What is required, therefore, is a method for forming color filters on ICs that allows deep sub-micrometer alignment and etch resolution while allowing the use of materials optimized to transmit colored light. In addition, the structure should offer improved adhesion between the filter and the IC.

SUMMARY OF THE INVENTION

In accordance with the present invention, a contiguous filter structure made of individual filter elements is formed in an integrated circuit passivation layer. Individual filter elements are each aligned over corresponding underlying photodetector devices and each filter element transmits light of a selected color. The filter elements are formed in holes placed in a covering passivation layer by using a via etch.

In one embodiment, three patterns of individual filter elements are formed to make a single filter structure overlying portions of individual chips on a processed wafer. A first pattern of holes, aligned with a first set of underlying photodetector devices, is etched into a covering passivation layer using conventional via etch procedures. The holes do not penetrate the passivation layer. In a three micrometer thick passivation layer, for example, holes are typically one to two micrometers deep. Other hole depths may be used depending on passivation layer thickness and desired filter element thickness. A first light transmitting material, typically a resist that transmits light corresponding to a single color, is spun on to the wafer so that the light transmitting material fills the etched holes. The light transmitting material is baked (or cured) using conventional procedures and is then etched back to expose the passivation layer surface not etched with the first pattern of holes. Thus a layer of the first light transmitting material remains as individual filter elements in each of the first holes.

A second pattern of holes, aligned to a second set of underlying photodetector devices, is then etched into the passivation layer using procedures similar to those used to form the first pattern of holes. A second light transmitting material is spun on, cured, and etched back to expose all remaining passivation layer surface portions not covered by the first or second patterns of holes. Thus a layer of the second material remains as individual filter elements in each of the second holes.

A third pattern of holes is then etched into the passivation layer. This pattern includes holes aligned to a third set of underlying photodetector devices and may include any other portion of the passivation layer not covered by the remaining layers of first or second light transmitting materials. Individual chip areas not containing underlying photodetector devices are masked in some embodiments. In other embodiments, a blanket passivation layer etch is performed. The first and second light transmitting materials in the first and second holes block the third passivation layer etch, so the etch is self-aligning. After etch, a third light transmitting material is spun on to fill the third pattern of etched holes and is cured. A final etch is performed to expose the existing individual filter elements formed in the first and second pattern of holes. In this way a contiguous filter structure is formed of three patterns of individual filter elements. Each unique pattern of filter elements is formed to transmit a unique light color to a corresponding unique set of underlying devices.

Holes are typically square-shaped, although other shapes are possible. In some embodiments, selected holes may be etched deeper than others so that individual filter elements in these deeper holes experience additional adhesion from sidewall contact. In still other embodiments, some holes may be etched to have a bottom wider than a top opening (undercut etch), providing even better filter element adhesion to the passivation layer.

In some embodiments, more or less than three colored light transmitting materials may be used. Portions of the passivation layer may not be etched in some embodiments. Transmitted light is not limited to the visible spectrum; some individual filter elements may be formed to transmit infrared or ultraviolet light, for example. Some embodiments may include a clear material layer over the filter.

This filter has several advantages. Among the advantages, a first is that the contiguous individual filter elements provide lateral support for each other. Junctions between individual filter elements provide greater adhesion and prevent individual elements from becoming dislodged. Second, the light transmitting material requirements are less stringent than those used in current methods because the material has no special photolithographic or etch requirements. Third, this method uses existing photolithographic processes so that sub-micrometer hole dimensions are easily achieved. Finally, the fabrication process may omit a masking step for etching the passivation layer to receive the final colored light transmitting material as the last set of colored filter elements is formed.

DETAILED DESCRIPTION

The vertical scale is exaggerated in the accompanying drawings to more clearly illustrate an embodiment of the invention. In the following text, embodiments of the method to form a structure in accordance with the invention, and of the structure itself in accordance with the invention, are concurrently described. The word "contiguous" as used here means that individual filter elements are in contact with each other, although vacancies may exist within the filter structure.

Figure 1A:
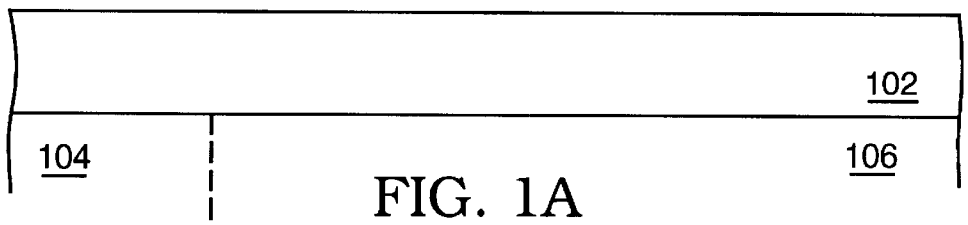
FIGS. 1A–1J are cross section views illustrating a filter structure formed using a sequential method in accordance with the invention.

FIG. 1A is a cross section view of an integrated circuit having a covering passivation layer 102 overlying a logic circuit area 104 and array circuit area 106 in a substrate. Passivation layer 102 is typically one to three micrometers thick, and is formed of any transparent material. Silicon dioxide ($SiO_2$) is used to form passivation layer 102 in one embodiment. Other suitable transparent materials commonly used include silicon nitride and silicon oxynitride. Logic area 104 may contain devices related to photodetection circuit operation, such as complementary metal oxide semiconductor (CMOS) logic circuits. Array circuit area 106 may include selected devices capable of storing an electric charge representing an amount of incident light, such as CMOS junctions or charge coupled devices (CCDs). In other embodiments, however, circuit area 106 may contain light generating devices, or other devices whose operation is related to reception and generation of light.

Figure 1B:
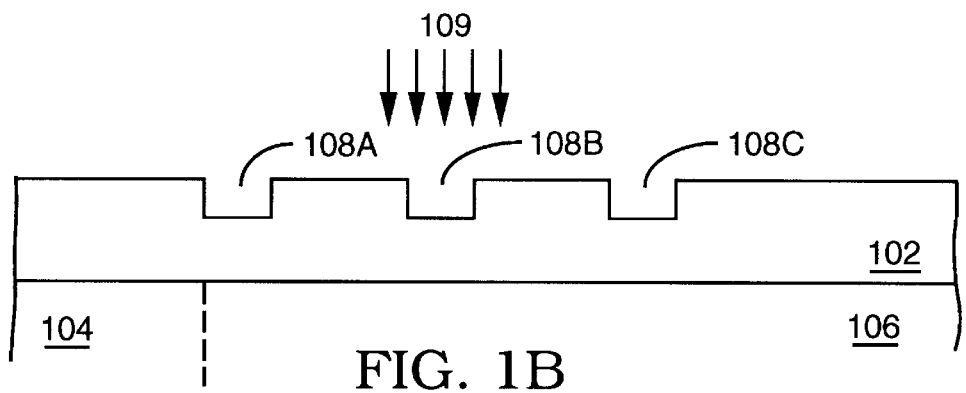

A first material capable of transmitting light at a wavelength or range of wavelengths representing a selected color in the visible spectrum is placed into the passivation layer as follows. Referring to FIG. 1B, a first pattern of holes, represented by holes 108A, 108B, and 108C, is etched into passivation layer 102. The first pattern of holes is defined and etched using conventional sub-micrometer via etch methods. Holes 108A, 108B, and 108C are positioned so that selected underlying circuit area 106 devices (not shown) receive light, represented by arrows 109, through light transmitting material filling the holes as described below. Proper mask alignment for the etch may be achieved with conventional processing equipment, such as a PERKIN ELMER aligner or a NIKON stepper. Lateral hole dimensions depend on desired lateral pixel size for light sensing, typically seven micrometers square, but other sizes and shapes are possible depending on underlying device dimensions.

Hole depth depends on passivation layer thickness. The exact hole depth is not critical. Holes must be deep enough to accept sufficient filter material to form an individual filter element, yet not so deep as to penetrate passivation layer 102. Filter element thickness is described in detail below.

There is no preferred ratio of hole depth to passivation layer 102 thickness. Hole aspect (depth:width) ratios are typically low (1:7 for example), a property that allows holes to be completely filled as described below.

In the embodiment shown, holes 108A, 108B, and 108C are etched in passivation layer 102 to a depth of one to two micrometers using a LAM plasma etcher and standard fixed time via etch methods known in the art. To achieve a fixed time etch rate of approximately eighty (80) seconds per micrometer, for example, an etch process is conducted using an 800 watt power level at 700 millitorr. Argon is introduced at 200 sccm, $CF_4$ at 15 sccm, and $CHF_3$ at 15 sccm. After the etch, the wafer is cleaned using conventional processes.

Figure 1C:
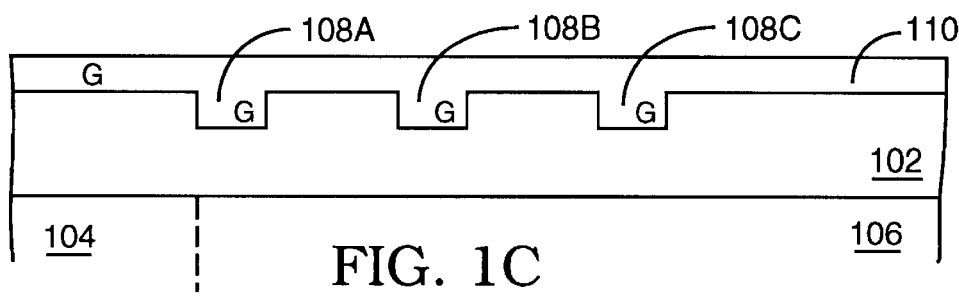

FIG. 1C is a cross section view showing a layer of first light transmitting material 110 deposited over pasoivation layer 102. First material 110 is deposited using conventional spin-on methods so that a 1.0 to 1.4 micrometer thick layer results. First material layer 110, transmitting green light for example, overlies the entire wafer surface and fills etched holes 108A, 108B, and 108C. After spin-on, first material layer 110 is baked (cured) using conventional processes. For example, in one embodiment material layer 110 is exposed to 100 degrees Celsius for approximately 8 minutes in a wafer-by-wafer process. In another embodiment currently under development, several wafers are simultaneously cured in a batch process. For example, twenty-four wafers may be exposed to 100 degrees Celcius for approximately 20 minutes. An advantage of such a batch curing process is that the process saves time.

In some embodiments, colored resist is used as the light transmitting material. In one embodiment, for example, resists manufactured by Fuji-Hunt are used. Type CG7001 is used for a green light transmitting material, SVB-5612 is used for a blue light transmitting material, and CR7001 is used for a red light transmitting material. Other embodiments may use other colored materials, such as paint or dye. The colored material should have a molecular structure that will allow individual filter elements to have a horizontal molecular profile after processing as described herein because hole depth is shallow.

Figure 1D:
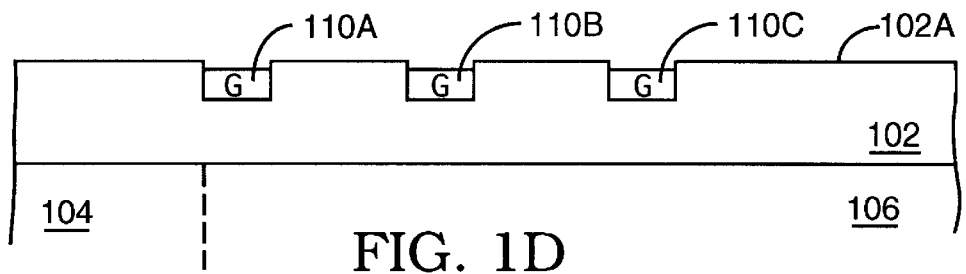

FIG. 1D is a cross section view showing the first light transmitting material layer 110 selectively etched back so that first colored filter elements 110A, 110B, and 110C remain only in holes 108A, 108B, and 108C respectively. Conventional resist etchback processes may be used. For example, using a dry etch at 600 watts and 800 millitorr, Ar is introduced at 800 sccm, $CF_4$ at 20 sccm, $N_2$ at 200 sccm, and $O_2$ at 20 sccm. Note that first light transmitting material layer 110 is etched back slightly below the surface 102A of passivation layer 102.

The etch for the first material is a fixed time process. Using well-known techniques, an acceptable etch time process window is easily determined without undue experimentation for the material types and thicknesses used. An etch is performed and a cross-section of the etched wafer is analyzed for the result. If more or less etch is required, the etch time is adjusted and another etch is made and analyzed until an acceptable time window is established. Once a process window is established, the production process is run using the experimentally determined time. In one embodiment, a 70–80 second time window is established.

Actual filter element thickness will depend on optical properties of the light transmitting material. Filter element thickness is optimized between two conflicting design requirements. First, sharp spectral transmission is desired. That is, a filter element should transmit only one particular color. Spectral transmission increases as filter thickness increases. But maximum light energy reaching an underlying device is also desired, and energy transmission decreases as filter thickness increases. Thus filter element thickness is optimized between spectral transmission and energy transmission requirements. Present embodiments use approximately one micrometer filter element thickness.

Figure 1E:
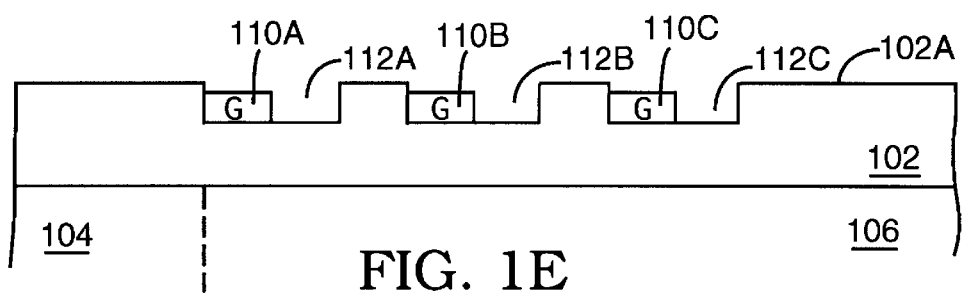

A second light transmitting material may now be deposited to form filter elements that transmit light at a wavelength or range of wavelengths representing a second color. FIG. 1E shows a second pattern of holes, represented by holes 112A, 112B, and 112C, aligned and etched in positions corresponding to the second color filter element positions. As with holes 108A–C (FIG. 1B) for the first material, conventional via etch methods are used to form the second pattern of holes. And as with holes 108A–C, the etch depth for holes 112A–C also is not critical and may be slightly deeper or shallower than previously etched holes. Ideally, filter element thickness should be optimized for each particular colored material used, as described above regarding spectral and energy transmission. Consequently hole depth should be varied for selected colored materials. It is possible to fabricate embodiments having hole depth optimized to form a particular filter element thickness for a particular colored material. In practice, however, using filter elements of the same thickness for each colored material works well—approximately 1 micrometer. After etching holes in the second pattern, the wafer is again cleaned using conventional processes.

Holes 112A, 112B, and 112C are positioned to be aligned over a second selected group of light sensitive devices (not shown). In some embodiments holes 112A, 112B, and 112C may be self-aligned to filter elements 110A, 110B, and 110C respectively. This self-alignment may be the result of an overlap with filter elements 110A–C due to a pattern alignment offset during masking. Self-alignment may also be achieved by slightly increasing the size of holes 112A, 112B, and 112C without introducing an intentional alignment offset. The self-alignment results because the colored material forming the first filter elements 110A–C blocks the etch used to form holes 112A, 112B, and 112C. In embodiments using self-alignment, extremely high selectivities, greater than fifty to one (50:1), may be achieved as needed by reducing or removing oxygen bled into the system during the etch process. In practice, the etch is done by process development as described above, and selectivities may not be measured. In embodiments not using self-alignment, a small amount of passivation layer 102 may remain between material forming the first color filter elements and holes formed to receive material used to form second color filter elements. In these embodiments the remaining passivation layer between filter materials filling the first and second holes provides increased adhesion for the individual filter elements due to the passivation layer sidewall-filter element junction. In still other embodiments, any portion of passivation layer 102 remaining between first and second filter elements is removed during an etch for a third filter material, described in detail below. The third filter material deposited between the first and second filter elements acts to form a contiguous filter structure over device area 106, again enhancing individual filter element adhesion.

Figure 1F:
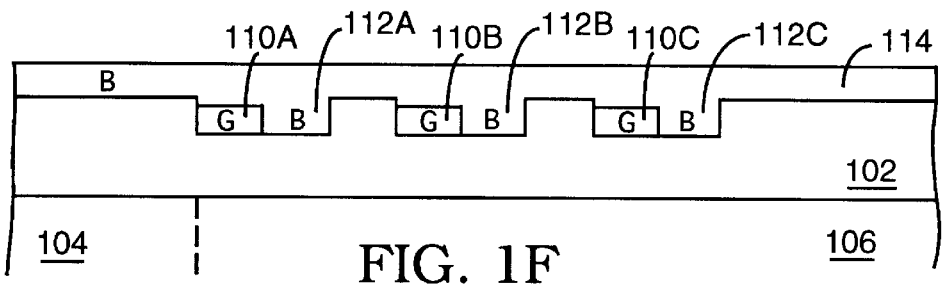

FIG. 1F is a cross section view showing a second light transmitting material layer 114, transmitting blue light for example, deposited on passivation layer 102 using a spin-on process as described above. Second light transmitting material fills holes 112A, 112B, and 112C. The second material layer 114 also may be cured using conventional methods that ensure no, or inconsequential, interaction with filter elements 110A, 110B, and 110C.

Figure 1G:
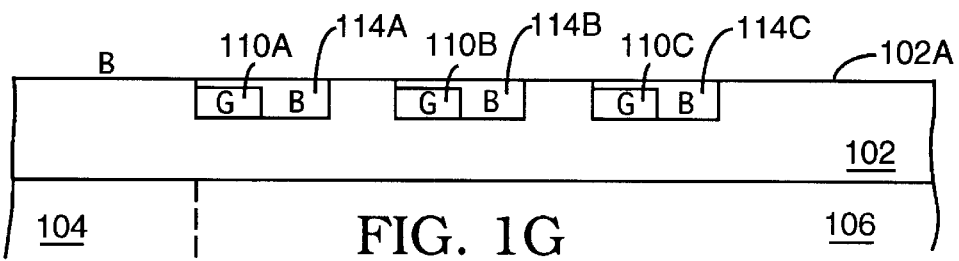

FIG. 1G is a cross section view showing second material layer 114 etched back to passivation layer 102 surface 102A so that second color filter elements 114A, 114B, and 114C remain in holes 112A, 112B, and 112C respectively. Note that this etchback is not a critical etch and may stop at any point after passivation layer 102 surface 102A is exposed. For example, FIG. 1G shows a slight residue of second material layer 114 above first color filter elements 110A, 110B, and 110C, but this residue will be removed during a later etchback as described below. Alternatively, etchback for second material layer 114 may continue to expose filter elements 110A–C. The specific etch time used to etch second material layer 114 so as to produce a specific embodiment is easily determined by experiment, as described above for etching first material layer 110.

Figure 1H:
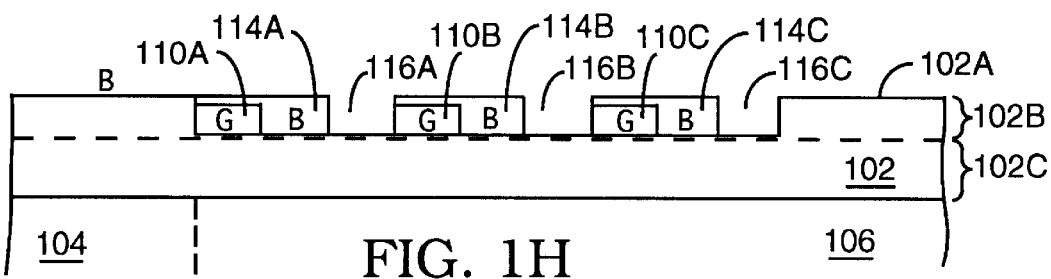

A third and final light transmitting material may now be deposited as follows. FIG. 1H is a cross section view showing a blanket etch performed on a portion of passivation layer 102 overlying array area 106. The etch may be performed as described above for holes 108A, 108B, and 108C. As shown for this embodiment, the blanket etch opens all remaining passivation layer 102 surface 102A areas not covered by color filter elements 110A–C and 114A–C, thus forming holes 116A, 116B, and 116C. This etch, therefore, is self-aligning. In some embodiments, a conventional blanket or blocking mask may be placed over the wafer's logic area 104 and/or pad areas (not shown). Other embodiments may omit the blanket mask if, for example, light falling in that area is inconsequential or no need for an overlying layer exists. If a blanket mask does not overly logic area 104, an entire remaining passivation layer 102 top portion 102B will be etched. However, sufficient layer 102 portion 102C remains after etching portion 102B to safeguard the chip from contaminants. After etching, the wafer is once again cleaned using conventional methods.

Figure 1I:
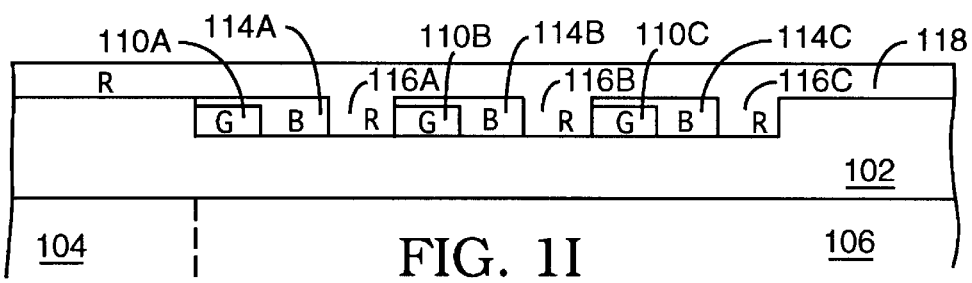

FIG. 1I is a cross section view showing a third light transmitting material layer 118, transmitting red light for example, deposited on passivation layer 102 using a spin-on process as described above. Third light transmitting material fills holes 116A, 116B, and 116C to form filter elements 118A, 118B, and 118C respectively. Third material layer 118 may be cured using conventional methods that ensure no interaction with filter elements 114A–C, or elements 110A–C if exposed during a previous etch.

Figure 1J:
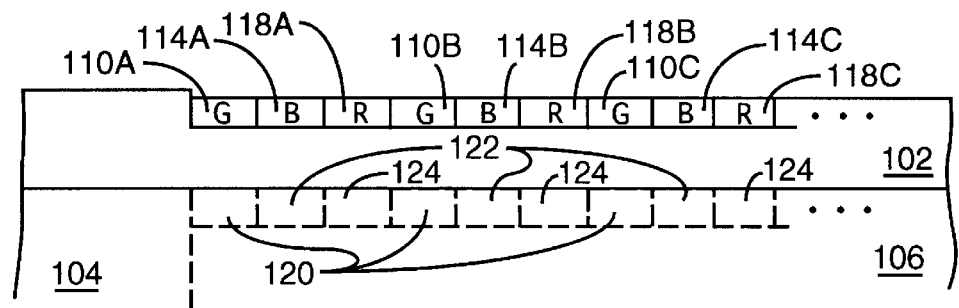

Finally, as shown in FIG. 1J, a selective blanket etchback is performed so as to remove both a portion of third light transmitting material layer 118, and any second light transmitting material layer 114 residue overlying first color filter elements 110A–C. As described above in relation to etching first material layer 110, this is a fixed time etch. A specific etch time for a specific embodiment is easily determined by experiment. For example, less time may be required for embodiments in which no second filter material 114 residue overlies the first filter elements 110A–C. As shown for this embodiment, however, the selective blanket etch removes layer 114 residue to expose first color filter element 110A–C top surfaces. A contiguous three-color filter having first color filter elements 110A–C, second color filter elements 114A–C, and third color filter elements 118A, 118B, and 118C remains overlying array area 106. As shown, a first set of integrated circuit optical sensors located in regions 120 receives green light, a second set located in regions 122 receives blue light, and a third set located in regions 124 receives red light.

Figure 2:
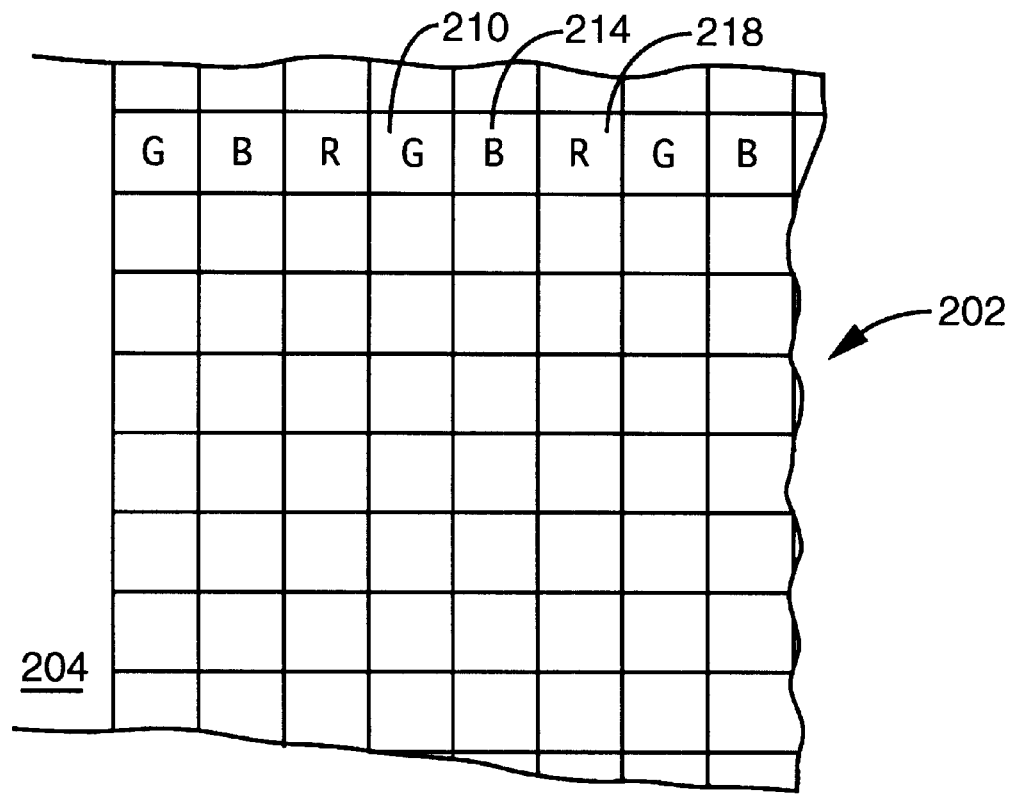
FIG. 2 is a plan view of a filter structure formed in accordance with the invention.

FIG. 2 is a plan view of a color filter region 202 formed on an integrated circuit in accordance with the invention. An array area containing light sensitive devices (not shown) underlies color filter region 202, and an adjacent CMOS area 204 is shown. Using a method as described above, first, second, and third light transmitting materials are placed in approximately square-shaped holes in filter region 202.

The relative percent of filter elements for each color depends on the chip's intended use. In filter embodiments transmitting three unique colors, the filters for each color may each cover one-third of the total filter area. As shown in FIG. 2 for example, square 210 may contain a green light transmitting filter element, square 214 a blue light transmitting filter element, and square 218 a red light transmitting filter element. The alternating green-blue-red pattern may then be repeated for remaining filter elements throughout filter region 202. In other embodiments the relative ratio of filter elements, each transmitting a unique colored light, may vary. For example, in some embodiments filter elements transmitting green light may cover one-half the total filter region 202, while filter elements transmitting blue and red light may each cover one-fourth. Other patterns may be formed when using filter elements transmitting more or less than three light colors.

Other embodiments exist in accordance with the present invention. For example, embodiments may form filter elements using material transmitting colored light other than red, green, or blue. Some embodiments may have filter elements formed to transmit light in other parts of the visible spectrum, or in other ranges of the electromagnetic spectrum such as infrared or ultraviolet. Filter element thickness may be varied depending on the material used and the frequency or range of frequencies the filter element must transmit, as well as on spectral and energy transmission requirements discussed above. Thus, the term "light" used herein may be broadly construed to include any photon-transmitted energy. Some embodiments of this invention may be formed over devices that generate, reflect, or refract light.

Figure 5:
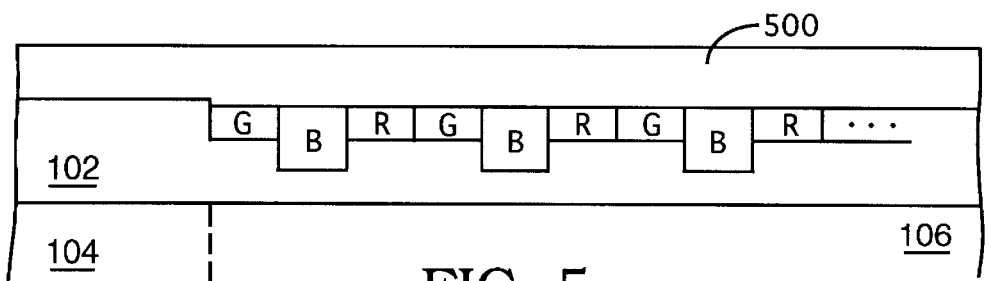
FIG. 5 is an illustration of a clear layer formed over a filter.

In some embodiments, a clear material layer 500, as illustrated in FIG. 5, transmitting a broad light spectrum may overlie the filter. In embodiments including such a clear layer, the clear layer may have consistent thickness over all underlying filter elements, thus protecting the filter elements during packaging. A clear layer thickness may be approximately 10 micrometers or less. In one embodiment a clear layer is formed using CT-S118, also manufactured by Fuji-Hunt.

The method and filter structure described here includes certain advantages. Among the advantages, a first is that the formation method uses a photolithographic process in a way similar to that presently used to define microelectronic contacts (via etch). The current photolithographic via etch process, including resist processing techniques, routinely achieves hole sizes down to 0.5 micrometers, and deep sub-micrometer alignment is standard. There is no need to rely on developing and forming filter islands from a thick film colored resist layer that has been selected to be optimized for color transmission and not for etch resolution.

Second, the light transmitting material requirements are much less stringent than those used in the current method because the materials employed in embodiments of this invention have no special photolithographic or etch requirements. The light transmitting material fills etched holes rather than being pattern etched itself. As discussed above, resolution in color transmitting material films depends on molecular structure. It is difficult to achieve a well-defined resolution profile at sub-micrometer geometries if material molecule lengths exceed these geometries.

Third, individual filter element adhesion is greatly enhanced. For embodiments in which an individual filter element is in a passivation layer hole, the element is held in place not only by surface adhesion but also by adhesive force from the hole sidewalls. In embodiments in which an individual filter element is part of a contiguous structure of individual filter elements, the filter element is held in place not only by surface adhesion with the passivation layer but by the adhesive force from the junctions with adjacent filter elements. Thus each individual filter element provides adhesive support to, and in turn receives adhesive support from, adjacent individual filter elements. In some embodiments, both individual filter element and contiguous filter structure adhesion may be enhanced by intentionally etching some holes deeper than others. Filter elements formed in these deeper holes may experience enhanced adhesion due to sidewall contact with the passivation layer. In embodiments using such deeper holes, hole sidewalls may be undercut during etch so that hole bottoms are wider than tops. One procedure to form such holes is to form passivation layer 102 using a silicon nitride layer and an overlying silicon dioxide layer. During dry etch, the overlying oxide layer would have essentially vertical walls, whereas the underlying nitride layer would tend to be undercut. Thus filter elements formed in these undercut holes further assist adhesion.

Figure 3A:
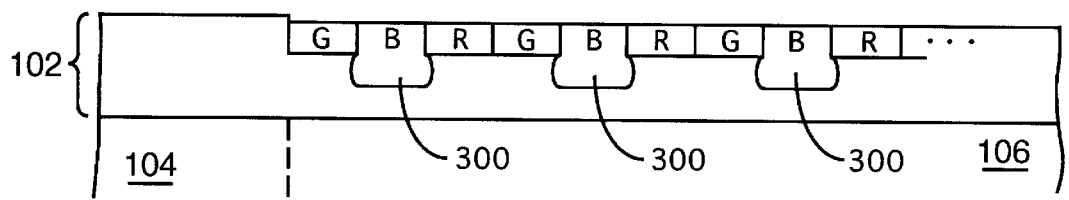
FIG. 3A is an illustration of selected holes formed to have a bottom width greater than a top width.
Figure 3B:
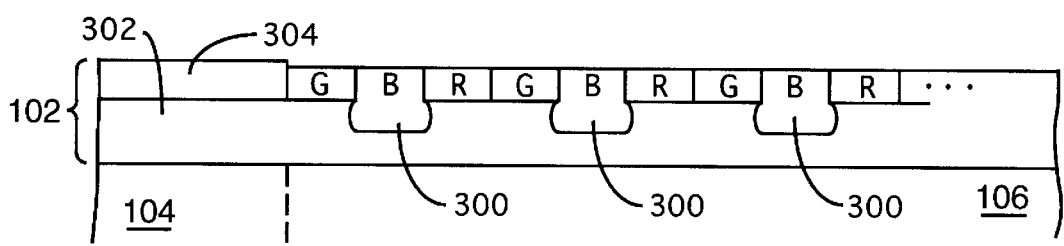
FIG. 3B is an illustration of a substrate having a passivation layer formed thereon.
Figure 4:
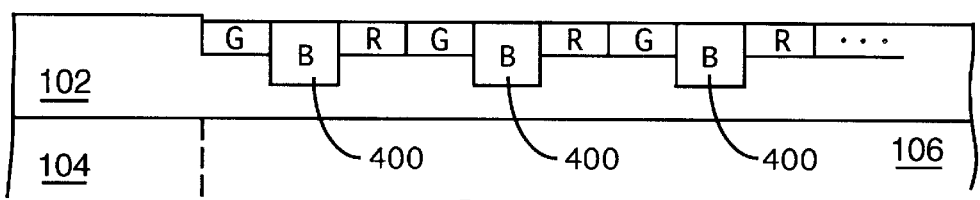
FIG. 4 is an illustration of selected holes formed to have a depth greater than the remaining holes.

FIG. 3A shows selected holes 300 having a bottom width greater than a top width as described above. FIG. 3B shows passivation layer 102 comprised of silicon nitride layer 302 and silicon dioxide layer 304 overlying layer 302. FIG. 4 shows selected holes 400 formed to have a depth greater than the remaining holes.

As another advantage, embodiments of the method in which the final light transmitting material layer is deposited after performing a blanket etch of the passivation layer to remove all surface portions not covered by previously formed filter elements omit a masking step. Present methods forming individual filter islands require such a masking step to form filter islands for each unique color to be filtered.

While the present invention has been described in terms of specific embodiments, those skilled in the art will appreciate that many modifications and variations exist that fall within the spirit and scope of the present invention.

I claim:

1. An integrated circuit comprising:
   a covering layer overlying at least a portion of said integrated circuit, said covering layer having first holes and second holes formed therein, said first holes being aligned in a first pattern over first selected devices formed in said integrated circuit, said second holes being aligned in a second pattern over second selected devices formed in said integrated circuit;
   a first filter capable of transmitting light at a first selected frequency or range of frequencies formed in said first holes; and
   a second filter contiguous with said first filter and capable of transmitting light at a second selected frequency or range of frequencies formed in said second holes;
   wherein selected holes are formed to have a depth greater than the remaining holes.

2. An integrated circuit comprising:
   a covering layer overlying at least a portion of said integrated circuit, said covering layer having first holes and second holes formed therein, said first holes being aligned in a first pattern over first selected devices formed in said integrated circuit, said second holes being aligned in a second pattern over second selected devices formed in said integrated circuit;

a first filter capable of transmitting light at a first selected frequency or range of frequencies formed in said first holes; and a second filter capable of transmitting light at a second selected frequency or range of frequencies formed in said second holes;

wherein selected holes are formed to have a bottom width greater than a top width.

3. The integrated circuit of claim 1 wherein a clear layer is formed over said first filter.

4. The integrated circuit of claim 3 wherein said clear layer is formed to have a thickness that provides a specified optical distance for an underlying device.

5. An integrated circuit comprising:

a substrate having a passivation layer formed thereon, said passivation layer having a top portion opposite said substrate, said top portion having at least one first hole and at least one second hole formed therein;

a first filter element formed in said at least one first hole, wherein said first filter element is formed to transmit light of a first frequency or first range of frequencies; and a second filter element formed in said at least one second hole and to be in contact with said first filter element, wherein said second filter element is formed to transmit light of a second frequency different from said first frequency or a second range of frequencies different from said first range of frequencies;

wherein said at least one first hole is formed to have a depth greater than said second at least one hole.

6. The integrated circuit of claim 5 wherein:

said first filter element is formed to have a thickness between a first selected thickness and a second selected thickness, said first selected thickness providing a minimum specified spectral transmission through said first filter element for said first frequency or said first range of frequencies, and said second selected thickness providing a minimum specified energy transmission through said second filter element for said second frequency or said second range of frequencies; and said second filter element is formed to have a thickness between a third selected thickness and a fourth selected thickness, said third selected thickness providing a minimum specified spectral transmission through said second filter element for said second frequency or said second range of frequencies, and said fourth selected thickness providing a minimum specified energy transmission through said second filter element for said second frequency or said second range of frequencies.

7. The integrated circuit of claim 5 wherein said first filter element is formed to have a thickness between a first selected thickness and a second selected thickness, said first selected thickness providing a minimum specified spectral transmission through said first filter element for said first frequency or said first range of frequencies, and said second selected thickness providing a minimum specified energy transmission through said first filter element for said first frequency or said first range of frequencies.

8. The integrated circuit of claim 2, wherein said first filter and said second filter are contiguous.

9. The integrated circuit of claim 5, wherein said at least one first hole is formed to have a bottom width greater than a top width.

10. The integrated circuit of claim 5, wherein a clear layer is formed over said first filter element.

11. The integrated circuit of claim 10, wherein said clear layer is formed to have a thickness that provides a specified optical distance for an underlying device.

12. The integrated circuit of claim 10, wherein the clear layer comprises a first layer overlying a second layer.

13. The integrated circuit of claim 12, wherein the first layer comprises silicon dioxide and the second layer comprises silicon nitride.

* * * * *